United States Patent
Yasooka

(10) Patent No.: US 9,685,418 B2
(45) Date of Patent: Jun. 20, 2017

(54) HIGH-FREQUENCY PACKAGE

(71) Applicant: Mitsubishi Electric Corporation, Chiyoda-ku (JP)

(72) Inventor: Kosuke Yasooka, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/119,494

(22) PCT Filed: Mar. 11, 2014

(86) PCT No.: PCT/JP2014/056370
§ 371 (c)(1),
(2) Date: Aug. 17, 2016

(87) PCT Pub. No.: WO2015/136629
PCT Pub. Date: Sep. 17, 2015

(65) Prior Publication Data
US 2017/0012008 A1    Jan. 12, 2017

(51) Int. Cl.
*H01L 23/66* (2006.01)
*H01L 23/552* (2006.01)
(Continued)

(52) U.S. Cl.
CPC ........ *H01L 23/66* (2013.01); *H01L 23/49827* (2013.01); *H01L 23/49838* (2013.01);
(Continued)

(58) Field of Classification Search
CPC . H01L 23/552; H01L 23/66; H01L 23/49822; H01L 23/49838;
(Continued)

(56) References Cited

U.S. PATENT DOCUMENTS 6,018,125 A    1/2000  Collins et al.
6,057,600 A *  5/2000  Kitazawa ............... H01L 23/66
                                                257/691

(Continued)

FOREIGN PATENT DOCUMENTS

JP    10-256777 A    9/1998
JP    2013-126029 A  6/2013
WO    2007/091470 A1 8/2007

OTHER PUBLICATIONS

International Search Report issued Jun. 10, 2014 in PCT/JP2014/056370, filed Mar. 11, 2014.

*Primary Examiner* — Michael Trinh
(74) *Attorney, Agent, or Firm* — Oblon, McClelland, Maier & Neustadt, L.L.P.

(57) ABSTRACT

A high-frequency package has: a resin substrate; a high-frequency device mounted on a side of a first surface of the resin substrate; a ground surface conductor of a ground potential formed on a second surface of the resin substrate on an opposite side to the first surface; a transmission line for a high-frequency signal formed in an inner layer of the resin substrate; and a ground via of a ground potential formed within the resin substrate. A through hole is formed in the ground surface conductor. The ground via is placed between the transmission line and the through hole.

4 Claims, 1 Drawing Sheet

(51) Int. Cl.
*H05K 1/00* (2006.01)
*H01L 23/13* (2006.01)
*H01L 23/00* (2006.01)
*H01L 23/498* (2006.01)

(52) U.S. Cl.
CPC .............. *H01L 23/552* (2013.01); *H05K 1/00* (2013.01); *H01L 23/13* (2013.01); *H01L 23/49816* (2013.01); *H01L 23/49822* (2013.01); *H01L 24/16* (2013.01); *H01L 24/81* (2013.01); *H01L 2223/6627* (2013.01); *H01L 2223/6683* (2013.01); *H01L 2224/16225* (2013.01); *H01L 2224/81815* (2013.01); *H01L 2924/1423* (2013.01); *H01L 2924/1579* (2013.01); *H01L 2924/15151* (2013.01); *H01L 2924/15321* (2013.01)

(58) Field of Classification Search
CPC ............... H01L 23/49827; H01L 24/16; H01L 2224/16225; H01L 2223/6627; H01L 2223/6616; H01L 2223/6622; H01L 2223/6683

See application file for complete search history.

(56) References Cited

U.S. PATENT DOCUMENTS

| | | | |
|---|---|---|---|
| 6,163,233 A | 12/2000 | Adkins | |
| 6,356,173 B1* | 3/2002 | Nagata | H01L 23/66 257/664 |
| 6,985,056 B2* | 1/2006 | Kanno | H01L 23/66 333/22 R |
| 8,168,891 B1 | 5/2012 | Goergen et al. | |
| 9,070,961 B2* | 6/2015 | Suzuki | H01L 23/552 |
| 2009/0079648 A1* | 3/2009 | Matsuo | H01P 1/2135 343/771 |
| 2009/0107710 A1 | 4/2009 | Goergen | |
| 2010/0220448 A1* | 9/2010 | Nomura | H01L 23/3677 361/746 |
| 2011/0088842 A1 | 4/2011 | Goergen et al. | |
| 2015/0156863 A1 | 6/2015 | Goergen et al. | |

* cited by examiner

HIGH-FREQUENCY PACKAGE

FIELD

The present invention relates to a high-frequency package for accommodating a high-frequency device.

BACKGROUND

A high-frequency device that handles a high-frequency signal of a microwave band or a millimeter-wave band has been known. In a high-frequency package that accommodates such a high-frequency device, the high-frequency device is mounted on a dielectric substrate. In some cases, a transmission line for the high-frequency signal is provided in an inner layer of the dielectric substrate (see, for example, Patent Literature 1).

CITATION LIST

Patent Literature

Patent Literature 1: International Publication No. WO2007/091470

SUMMARY

Technical Problem

The inventor of the present application has recognized the following problem for the first time.

Let us consider a case where a "resin substrate" is used as a dielectric substrate on which a high-frequency device is mounted. During the process for manufacturing the resin substrate, moisture originating from cleaning liquid or the like intrudes into a core material or the like. The intruded moisture is confined within the resin substrate due to plating. After that, a reflow process causes gas to be generated within the resin substrate. At this time, if there is no escape for the gas, the gas expands within the resin substrate, which is likely to cause delamination.

In order to avoid such the delamination, it is considered to provide a large number of degassing holes on a ground surface of the resin substrate. In this case, however, a high-frequency signal of a microwave band or a millimeter-wave band originating from a transmission line in an inner layer of the resin substrate is likely to leak to the outside through the degassing holes. This causes deterioration in EMI (Electro-Magnetic Interference) characteristics.

An object of the present invention is to provide a technique that can prevent deterioration in EMI characteristics of a high-frequency package using a resin substrate.

Solution to Problem

In an aspect of the present invention, a high-frequency package has: a resin substrate; a high-frequency device mounted on a side of a first surface of the resin substrate; a ground surface conductor of a ground potential formed on a second surface of the resin substrate on an opposite side to the first surface; a transmission line for a high-frequency signal formed in an inner layer of the resin substrate; and a ground via of a ground potential formed within the resin substrate. A through hole is formed in the ground surface conductor. The ground via is placed between the transmission line and the through hole.

In another aspect of the present invention, a high-frequency package has: a resin substrate; a high-frequency device mounted on a side of a first surface of the resin substrate; a ground surface conductor of a ground potential formed on a second surface of the resin substrate on an opposite side to the first surface; and a transmission line for a high-frequency signal formed in an inner layer of the resin substrate. A through hole is formed in the ground surface conductor. A diameter of the through hole is less than half of a wavelength of the high-frequency signal.

Advantageous Effects of Invention

According to the present invention, it is possible to prevent deterioration in EMI characteristics of a high-frequency package using a resin substrate.

DESCRIPTION OF EMBODIMENTS

A high-frequency package according to an embodiment of the present invention will be described with reference to the accompanying drawings.

Embodiment

Figure 1:
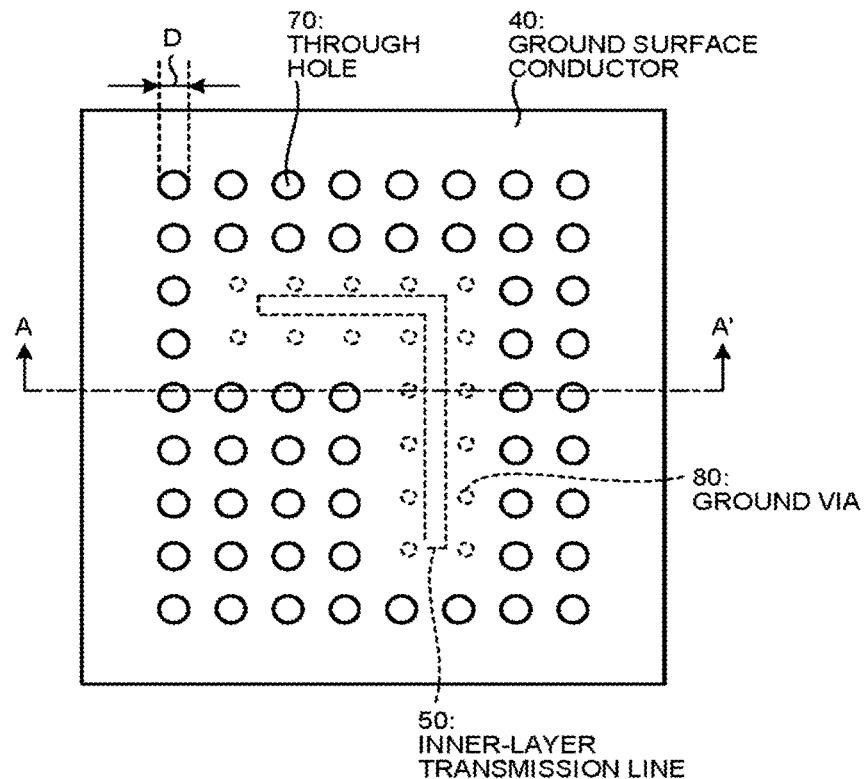
FIG. 1 is a top view of a resin substrate of a high-frequency package according to an embodiment of the present invention.
Figure 2:
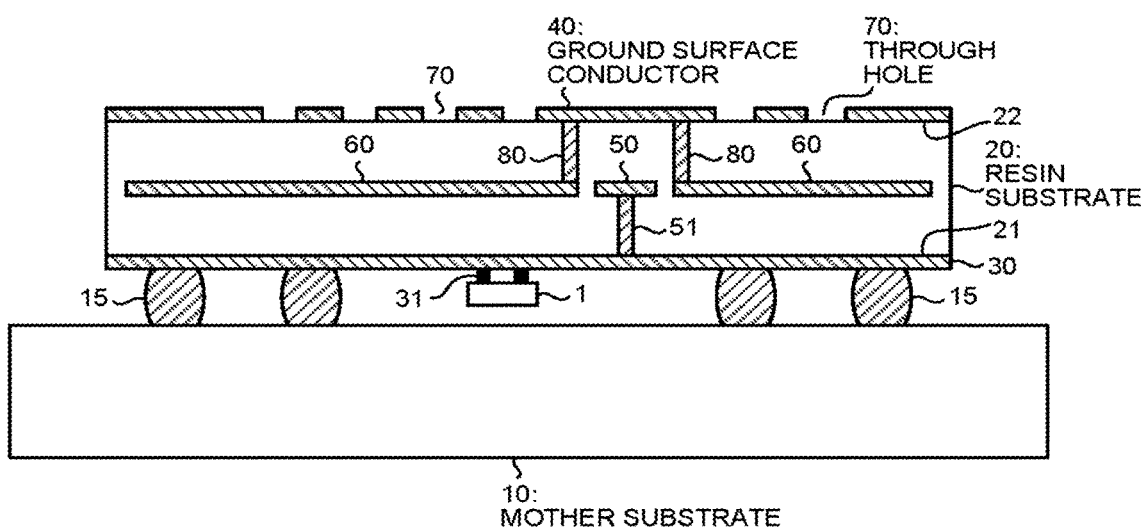
FIG. 2 is a cross-sectional view of the high-frequency package according to the embodiment of the present invention.

FIG. 1 is a top view of a resin substrate of a high-frequency package according to the present embodiment. FIG. 2 is a cross-sectional view of the high-frequency package according to the present embodiment, and illustrates a cross-sectional structure along a line A-A' in FIG. 1. It should be noted that in FIG. 1, some components formed in an inner layer of the resin substrate also are illustrated by dashed lines in order to facilitate understanding.

The high-frequency package according to the present embodiment accommodates a high-frequency device 1 that handles a high-frequency signal of a microwave band or a millimeter-wave band. For example, the high-frequency device 1 is exemplified by an MMIC (Monolithic Microwave Integrated Circuit) chip.

In the high-frequency package according to the present embodiment, two substrates facing each other are used. More specifically, as illustrated in FIG. 2, a mother substrate 10 on a lower side and a resin substrate 20 on an upper side are arranged to face each other. Further, inter-substrate connection conductors 15 connecting the mother substrate 10 and the resin substrate 20 are so arranged as to be sandwiched between the mother substrate 10 and the resin substrate 20. The high-frequency device 1 is placed in a space surrounded by the mother substrate 10, the resin substrate 20, and the inter-substrate connection conductors 15. More specifically, the high-frequency device 1 is mounted on the resin substrate 20.

The resin substrate 20 has a first surface 21 and a second surface 22. The first surface 21 is a surface (a device surface) on which side the high-frequency device 1 is mounted and that faces the mother substrate 10. The second substrate 22 is a surface on an opposite side to to the first surface 21, and is used for forming a ground surface as will be described later.

The high-frequency device 1 is mounted on the side of the first surface 21 of the resin substrate 20. More specifically, a surface-layer transmission line 30 and a ground wiring (not illustrated) are formed on the first surface 21 of the resin substrate 20. The high-frequency device 1 is flip-chip connected to the surface-layer transmission line 30 and the ground wire through bumps 31.

On the other hand, a ground surface conductor 40 is formed on the second surface 22 of the resin substrate 20. A potential of the ground surface conductor 40 is a ground potential. By this ground surface conductor 40, a ground surface is formed on the side of the second surface 22 of the resin substrate 20.

In an inner layer of the resin substrate 20, an inner-layer transmission line 50 as a transmission line for the high-frequency signal is formed. The inner-layer transmission line 50 is connected to the above-mentioned surface-layer transmission line 30 through a via 51. For example, the inner-layer transmission line 50 constitutes a tri-plate line. In this case, the above-mentioned ground surface conductor 40 on the second surface 22 also is a constituent element of the tri-plate line.

Furthermore, an inner-layer ground conductor 60 also is formed in an inner layer of the resin substrate 20. A potential of the inner-layer ground conductor 60 is the ground potential.

In the case where the resin substrate 20 is used, a reflow process causes gas to be generated within the resin substrate 20, as described above. At this time, if there is no escape for the gas, the gas expands within the resin substrate 20, which is likely to cause delamination. According to the present embodiment, in order to avoid such the delamination, a large number of through holes 70 for degassing are formed in the ground surface conductor 40 on the second surface 22 (see FIG. 1). However, the high-frequency signal of a microwave band or a millimeter-wave band originating from the inner-layer transmission line 50 is likely to leak to the outside through the through holes 70. This causes deterioration in EMI characteristics.

Therefore, according to the present embodiment, a diameter D of the through hole 70 is designed to be less than half of a wavelength λ of the high-frequency signal (D<λ/2). By decreasing the diameter of the through hole 70 in this manner, a cutoff frequency regarding the through hole 70 becomes equal to or higher than the frequency band used by the high-frequency device 1. As a result, leakage of the high-frequency signal from the through holes 70 is reduced.

Furthermore, according to the present embodiment, a ground via 80 formed within the resin substrate 20 is effectively utilized. A potential of the ground via 80 is the ground potential. For example, the ground via 80 is so formed within the resin substrate 20 as to connect between the ground surface conductor 40 and the inner-layer ground conductor 60. As illustrated in FIGS. 1 and 2, such the ground via 80 is placed between the inner-layer transmission line 50 and the through hole 70. That is, the ground via 80 of the ground potential is placed on the leakage path from the inner-layer transmission line 50 to the through hole 70. As a result of shielding effect by the ground via 80, the leakage of the high-frequency signal from the through hole 70 is reduced.

It is preferable that a large number of ground vias 80 are placed along the inner-layer transmission line 50, as illustrated in FIG. 1. It is further preferable that a large number of ground vias 80 are so placed as to surround the inner-layer transmission line 50. Due to these configurations, the shielding effect by the ground vias 80 becomes prominent, and thus the leakage of the high-frequency signal from the through holes 70 is greatly reduced.

According to the present embodiment, as described above, it is possible to prevent the delamination and to prevent deterioration in the EMI characteristics, even in the case where the resin substrate 20 is used.

The embodiment of the present invention has been described above with reference to the accompanying drawings. Note that the present invention is not limited to the above-described embodiment and can be modified as appropriate by persons skilled in the art without departing from the scope of the invention.

REFERENCE SIGNS LIST 1 high-frequency device, 10 mother substrate, 15 inter-substrate connection conductor, 20 resin substrate, 21 first surface, 22 second surface, 30 surface-layer transmission line, 31 bump, 40 ground surface conductor, 50 inner-layer transmission line, 51 via, 60 inner-layer ground conductor, 70 through hole, 80 ground via.

The invention claimed is:

1. A high-frequency package comprising:
a resin substrate;
a high-frequency device mounted on a side of a first surface of the resin substrate;
a ground surface conductor of a ground potential formed on a second surface of the resin substrate on an opposite side to the first surface;
a transmission line for a high-frequency signal formed in an inner layer of the resin substrate; and
a ground via of a ground potential formed within the resin substrate, wherein
a through hole is formed in the ground surface conductor, and
the ground via is placed between the transmission line and the through hole.

2. The high-frequency package according to claim 1, wherein
a number of the ground via is plural, and
the plural ground vias are placed along the transmission line.

3. The high-frequency package according to claim 1, wherein a diameter of the through hole is less than half of a wavelength of the high-frequency signal.

4. A high-frequency package comprising:
a resin substrate;
a high-frequency device mounted on a side of a first surface of the resin substrate;
a ground surface conductor of a ground potential formed on a second surface of the resin substrate on an opposite side to the first surface; and
a transmission line for a high-frequency signal formed in an inner layer of the resin substrate, wherein
a through hole is formed in the ground surface conductor, and
a diameter of the through hole is less than half of a wavelength of the high-frequency signal.

* * * * *